(12) United States Patent
Ramaswamy et al.

(10) Patent No.: US 11,626,513 B2
(45) Date of Patent: Apr. 11, 2023

(54) ANTENNA GATE FIELD PLATE ON 2DEG PLANAR FET

(71) Applicant: Intel Corporation, Santa Clara, CA (US)

(72) Inventors: Rahul Ramaswamy, Portland, OR (US); Nidhi Nidhi, Hillsboro, OR (US); Walid M. Hafez, Portland, OR (US); Johann C. Rode, Hillsboro, OR (US); Paul Fischer, Portland, OR (US); Han Wui Then, Portland, OR (US); Marko Radosavljevic, Portland, OR (US); Sansaptak Dasgupta, Hillsboro, OR (US); Heli Chetanbhai Vora, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 972 days.

(21) Appl. No.: 16/218,886

(22) Filed: Dec. 13, 2018

(65) Prior Publication Data

US 2020/0194578 A1 Jun. 18, 2020

(51) Int. Cl.
*H01L 29/417* (2006.01)
*H01L 29/778* (2006.01)
*H01L 29/66* (2006.01)
*H01L 29/423* (2006.01)
*H01L 29/43* (2006.01)
*H01L 21/285* (2006.01)
*H01L 29/40* (2006.01)
*H01L 21/02* (2006.01)
*H01L 29/20* (2006.01)

(52) U.S. Cl.
CPC ...... *H01L 29/7783* (2013.01); *H01L 21/0254* (2013.01); *H01L 21/02458* (2013.01); *H01L 21/28575* (2013.01); *H01L 29/2003* (2013.01); *H01L 29/407* (2013.01); *H01L 29/41766* (2013.01); *H01L 29/4232* (2013.01); *H01L 29/432* (2013.01); *H01L 29/66462* (2013.01); *H01L 29/778* (2013.01)

(58) Field of Classification Search
CPC ..... H01L 29/402–407; H01L 29/66431; H01L 29/66462; H01L 29/778–7789
See application file for complete search history.

(56) References Cited

U.S. PATENT DOCUMENTS 9,847,394 B2 * 12/2017 Prechtl ............ H01L 29/42316
2012/0241751 A1 * 9/2012 Yoshioka ........... H01L 29/7786
257/E29.089

(Continued)

*Primary Examiner* — Eric A. Ward
(74) *Attorney, Agent, or Firm* — Schwabe, Williamson & Wyatt, P.C.

(57) ABSTRACT

Embodiments include a transistor and methods of forming a transistor. In an embodiment, the transistor comprises a semiconductor channel, a source electrode on a first side of the semiconductor channel, a drain electrode on a second side of the semiconductor channel, a polarization layer over the semiconductor channel, an insulator stack over the polarization layer, and a gate electrode over the semiconductor channel. In an embodiment, the gate electrode comprises a main body that passes through the insulator stack and the polarization layer, and a first field plate extending out laterally from the main body.

15 Claims, 10 Drawing Sheets

(56) References Cited

U.S. PATENT DOCUMENTS

| | | | | |
|---|---|---|---|---|
| 2014/0070280 A1* | 3/2014 | Briere | .................. | H01L 29/778 |
| | | | | 257/194 |
| 2015/0187924 A1* | 7/2015 | Dasgupta | .......... | H01L 21/30612 |
| | | | | 438/172 |
| 2017/0345919 A1* | 11/2017 | Oyama | ............... | H01L 29/0657 |
| 2018/0277650 A1* | 9/2018 | Matsushita | ........... | H01L 29/518 |
| 2019/0088771 A1* | 3/2019 | Kuraguchi | ........ | H01L 29/42376 |
| 2019/0371927 A1* | 12/2019 | Kajiwara | ............ | H01L 29/4236 |

* cited by examiner

ANTENNA GATE FIELD PLATE ON 2DEG PLANAR FET

TECHNICAL FIELD

Embodiments of the disclosure are in the field of semiconductor structures and processing and, in particular, to two dimensional electron gas (2DEG) field effect transistors (FETs) with field plates.

BACKGROUND

High electron velocities and high breakdown strengths of 2DEG based FETs make them attractive devices to be used in high frequency and high voltages applications. However, the breakdown voltage of these devices is known to be limited by an avalanche process occurring in the channel portion under the edge of the gate. In order to alleviate this problem field plates have been added above the gate electrode. Adding an extra piece of metal on top of the gate requires another layer in the device structure. As such, there is added complexity and cost to the fabrication of such 2DEG FETs.

DESCRIPTION OF THE EMBODIMENTS

Embodiments described herein comprise two dimensional electron gas (2DEG) field effect transistors (FETs) with field plates and methods of forming such devices. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, 2DEG FETs are attractive devices for high frequency and high voltage applications. Unfortunately, the benefits of such devices are not currently able to be fully realized due to avalanche processes that occur in the channel portion under the edge of the gate. While field plates have been proposed as a solution to this problem, current integration schemes are lacking. Accordingly, embodiments disclosed herein provide field plates that are integrated with the gate electrode. The field plates may extend out laterally from the gate electrode in order to redistribute the electric field profile where avalanche breakdown is expected (i.e., proximate to the edge of the gate electrode). Furthermore, since the field plates are integrated with the gate electrode, they are located closer to the channel compared to field plates formed above the gate electrode. Accordingly, embodiments disclosed herein allow for higher breakdown voltages.

A first embodiment includes incorporating field plates that extend out laterally from the gate electrode. Such a configuration may be obtained by using stacks of insulating material that alternate between an etch susceptible layer and an etch resistant layer. Upon exposure to a wet etching chemistry, the etch susceptible layers are removed to form field plate openings that can be plated during deposition of material to form the gate electrode. Additional embodiments include lithographically patterning a structure with laterally extending field plates.

In an additional embodiment, the gate electrode may be formed through an insulator stack that comprises a variable etch rate over its thickness. Accordingly, when exposed to a wet etching chemistry the gate opening will form a stepped profile due to different lateral etch rates at different depths in the gate opening.

Referring now to FIG. 1, a cross-sectional illustration of a 2DEG FET 100 is shown, in accordance with an embodiment. In an embodiment, the 2DEG FET 100 may comprise a semiconductor substrate 104. The semiconductor substrate 104 may be any suitable material for forming a 2DEG FET 100. For example, the semiconductor substrate 104 may be GaN or another III-V semiconducting material. In an embodiment, a channel region 105 may be defined between a source electrode 141 and a drain electrode 142. In an embodiment, the source electrode 141 and the drain electrode 142 may be conductive materials, such as metal, a stack of metals, an alloy, or the like. A polarization layer 111 may be formed over the channel region 105. In an embodiment, a 2DEG 107 may be formed in the channel region 105 proximate to the interface between the channel region 105 and the polarization layer 111.

Figure 1A:
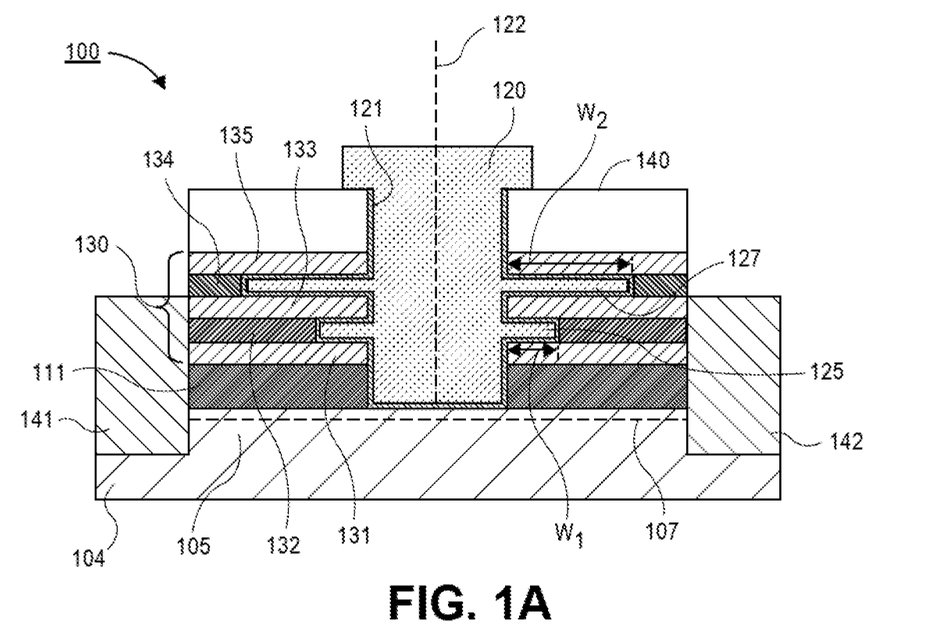
FIG. 1A is a cross-sectional illustration of a 2DEG FET with field plates formed adjacent to the gate electrode using an etch selective insulator stack, in accordance with an embodiment.

In an embodiment, an insulator stack 130 may be formed over the polarization layer 111. In an embodiment, the insulator stack 130 may comprise alternating layers of etch susceptible material and etch resistant material. For example, the etch resistant material may be a nitride (e.g., silicon nitride) and the etch susceptible material may be an oxide (e.g., silicon oxide). In the illustrated embodiment, layers 131, 1333, and 135 are etch resistant materials and layers 132 and 134 are etch susceptible materials. While two etch susceptible layers 132 and 134 are shown, it is to be appreciated that any number of etch susceptible layers may be included depending on the desired configuration. Particularly, a field plate may be formed in each etch susceptible layer, so if additional field plates are desired, then more etch susceptible layers may be included.

In an embodiment, the 2DEG FET 100 may include a gate electrode 120. A main body of the gate electrode 120 may extend through an oxide layer 140, the insulator stack 130, and through the polarization layer 111. In an embodiment, one or more field plates 125, 127 may extend out laterally from the main body of the gate electrode 120. The field plates 125, 127 extend over portions of the channel region 105 between the edge of the gate electrode 120 and the source and drain electrodes 141 and 142. In the illustrated embodiment, the field plates 125, 127 may be considered symmetric. That is, the field plates may be symmetric about a centerline 122 of the gate electrode 120 so that in each etch susceptible layer 132, 134 matching field plates 125, 127 extend between the source electrode 141 and the gate electrode 120 and extend between the source electrode 120 and the drain electrode 142.

In an embodiment, the field plates 125, 127 may have non-uniform widths W. For example the field plate 125 may have a first width $W_1$ and the field plate 127 may have a second width $W_2$. In an embodiment, the second width $W_2$ may be greater than the first width $W_1$. The non-uniform widths may be obtained by utilizing etch susceptible layers 132 and 134 that have different etch rates. For example, etch susceptible layer 134 may have an etch rate that is greater than an etch rate of etch susceptible layer 132. Accordingly, when etch susceptible layers 132 and 134 are exposed to a wet etching chemistry for the same amount of time, a greater lateral removal of etch susceptible layer 134 (relative to etch susceptible layer 132) will be obtained.

In the illustrated embodiment, each of the layers in the insulator stack 130 is shown as having a substantially uniform thickness. However, it is to be appreciated that embodiments may include layers with variable thicknesses. For example, the etch susceptible layers 132, 134 may have a thickness that is greater than a thickness of the etch resistant layers 131, 133, 135. In an embodiment, thicknesses of the field plates 125, 127 may be set by controlling the thicknesses of the etch susceptible layers 132, 134. In an embodiment, the field plates 125, 127 may have a uniform thickness. In other embodiments, a thickness of field plate 125 may be different than a thickness of field plate 127.

In an embodiment, the gate electrode 120 and the field plates 125, 127 may be any suitable conductive material. For example, the gate electrode 120 and the field plates 125, 127 may comprise stacks of one or more metal layers. As used herein, the term metal includes alloys, stacks, and other combinations of multiple metals. For example, the gate electrode 120 and field plates 125, 127 may include barrier layers (e.g., layers including one or more of Ta, TaN, Ti or TiN), stacks of different metals or alloys, etc. Thus, the gate electrode 120 and field plates 125, 127 may be a single material layer, or may be formed from several layers, including conductive liner layers and fill layers. Any suitable deposition process, such as atomic layer deposition (ALD) electroplating, chemical vapor deposition (CVD) or physical vapor deposition (PVD), may be used to form electrodes. In an embodiment, the gate electrode 120 and field plates 125, 127 are composed of a conductive material such as, but not limited to, Cu, Al, Ti, Zr, Hf, V, Ru, Co, Ni, Pd, Pt, W, Ag, Au or alloys thereof.

In an embodiment, the field plates 125, 127 and the gate electrode 120 may be lined with a gate dielectric 121. That is, the gate dielectric 121 may separate the main body of the gate electrode 120 from the channel region 105 in addition to lining the vertical sidewalls of the main body of the gate electrode 120. Additionally, the gate dielectric 121 may be formed over lateral and vertical surfaces of the field plates 125, 127. In an embodiment, the gate dielectric 121 may be any suitable gate dielectric material. The gate dielectric 121 may comprise one or more high-k dielectric materials. As used herein, "high-k" dielectric materials refers to materials that have a k-value that is greater than the k-value of $SiO_2$. For example, "high-k" dielectric materials may refer to dielectric materials with a k-value that is greater than 3.9. In an embodiment, the gate dielectric stack may comprise one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In an embodiment, the gate dielectric stack may also comprise high-k dielectric materials that are alloyed with or doped with silicon.

Figure 1B:
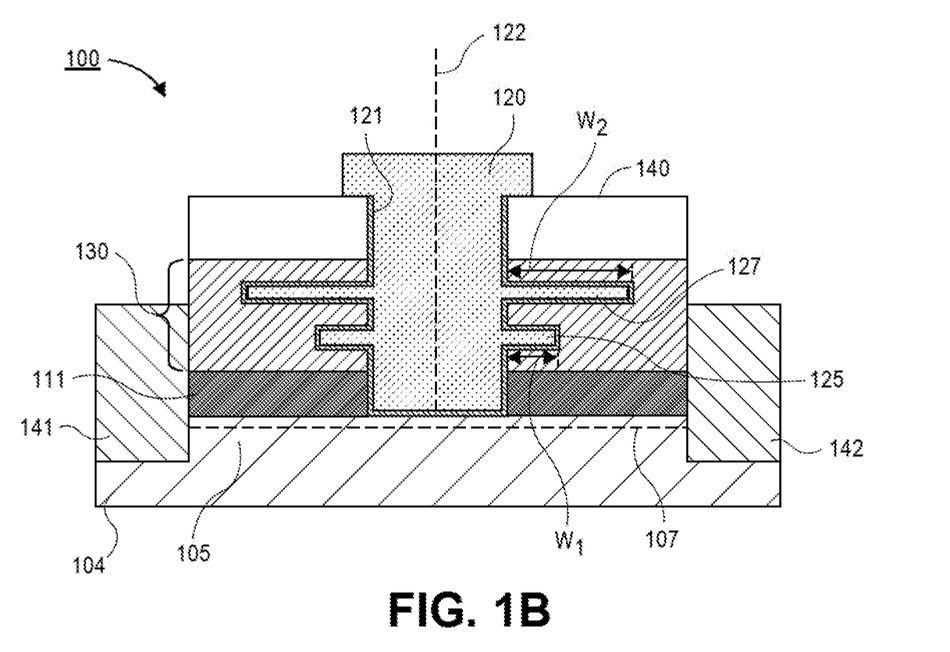
FIG. 1B is a cross-sectional illustration of a 2DEG FET with field plates formed adjacent to the gate electrode with a lithographic patterning process, in accordance with an embodiment.

Referring now to FIG. 1B, a cross-sectional illustration of a 2DEG FET 100 is shown in accordance with an additional embodiment. The 2DEG FET 100 shown in FIG. 1B is substantially similar to the 2DEG FET 100 shown in FIG. 1A, with the exception that the insulator stack 130 is formed with a single layer instead of having alternating layers of etch susceptible and etch resistant material. In such an embodiment, the field plates 125, 127 may be fabricated with a lithographic process. Accordingly, the field plates 125, 127 are not limited to the dimensions of the alternating layers, as is the case in the 2DEG FET 100 described above with respect to FIG. 1A. In an embodiment, the main body of the gate electrode 120 and the field plates 125, 127 may be patterned using a dummy gate material that is embedded in the insulator stack 130 and subsequently replaced with the gate dielectric and conductive material.

Figure 1C:
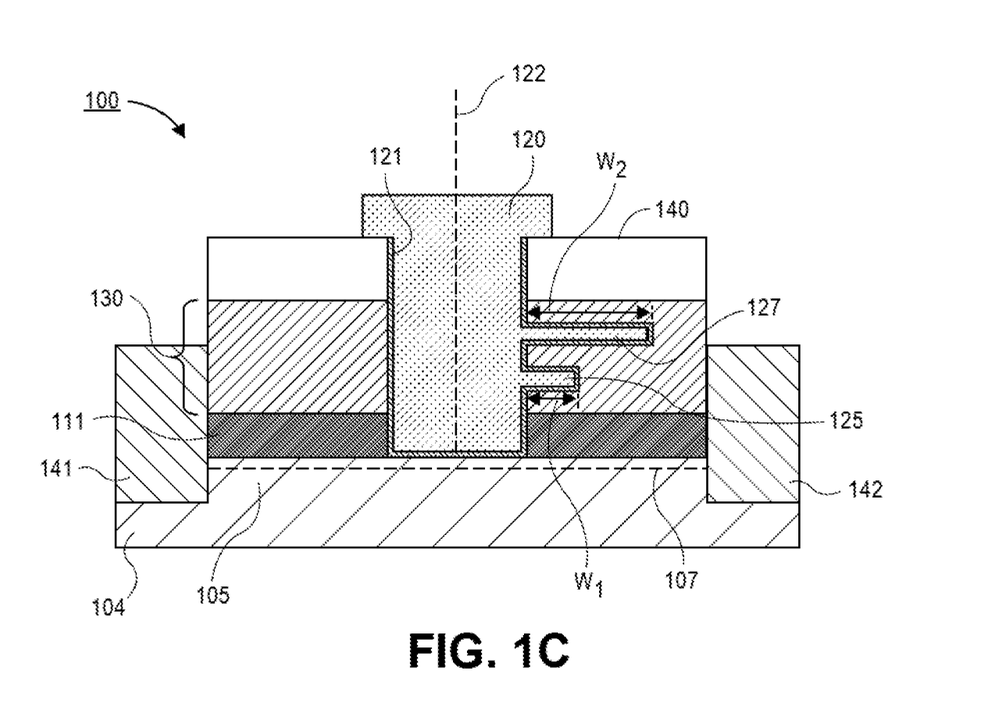
FIG. 1C is a cross-sectional illustration of a 2DEG FET with asymmetric field plates, in accordance with an embodiment.

Referring now to FIG. 1C, a cross-sectional illustration of a 2DEG FET 100 is shown, in accordance with yet another embodiment. The 2DEG FET 100 shown in FIG. 1C is substantially similar to the 2DEG FET 100 shown in FIG. 1B, with the exception that the field plates 125, 127 are not symmetric about centerline 122 of the gate electrode 120. Particularly, the field plates 125, 127 extend laterally out over the channel region 105 between the gate electrode 120 and the drain electrode 142. Such an embodiment may be particularly beneficial since the electric field between the gate electrode 120 and the drain electrode 142 is more susceptible to breakdown.

Figure 1D:
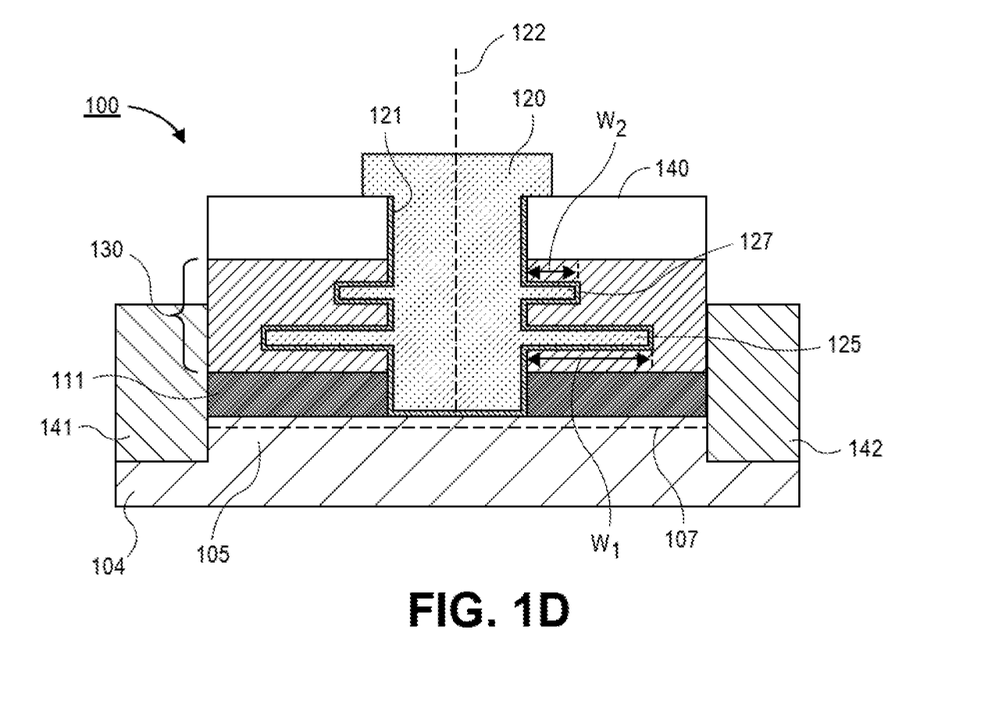
FIG. 1D is a cross-sectional illustration of a 2DEG FET with field plates formed adjacent to the gate electrode in accordance with an additional embodiment.

Referring now to FIG. 1D, a cross-sectional illustration of a 2DEG FET 100 is shown, in accordance with an additional embodiment. In an embodiment, the 2DEG FET 100 is substantially similar to the 2DEG FET 100 shown in FIG. 1B, with the exception that the field plates 125, 127 have the widths reversed. That is, the field plate 125 closest to the channel region 105 has a first width $W_1$ that is greater than a second width $W_2$ of the field plate 127. While shown with a single insulating layer 130, it is to be appreciated that such an embodiment may also be implemented with a multi-layer insulator stack 130 similar to what is shown in FIG. 1A.

Figure 2A:
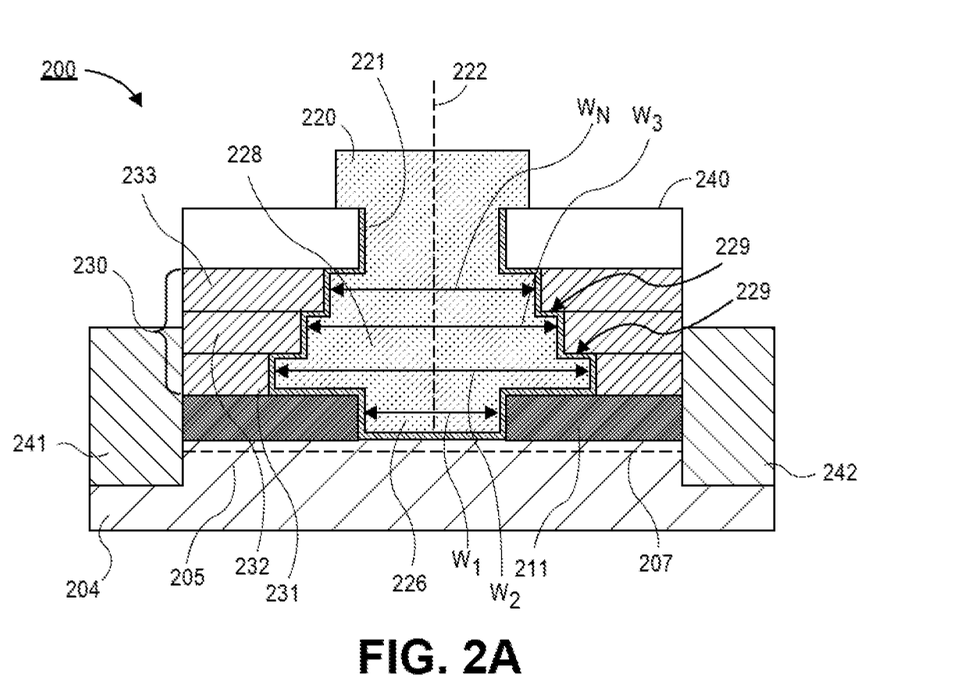
FIG. 2A is a cross-sectional illustration of a 2DEG FET with a gate electrode that includes a stepped field plate, in accordance with an embodiment.

Referring now to FIG. 2A, a cross-sectional illustration of a 2DEG FET 200 is shown, in accordance with an embodiment. In an embodiment, the 2DEG FET 200 may comprise a semiconductor substrate 204. The semiconductor substrate 204 may be any suitable material for forming a 2DEG FET 200. For example, the semiconductor substrate 204 may be GaN or another III-V semiconducting material. In an embodiment, a channel region 205 may be defined between a source electrode 241 and a drain electrode 242. In an embodiment, the source electrode 241 and the drain electrode 242 may be conductive materials, such as metal, a stack of metals, an alloy, or the like. A polarization layer 211 may be formed over the channel region 205. In an embodiment, a 2DEG 207 may be formed in the channel region 205 proximate to the interface between the channel region 205 and the polarization layer 211.

In an embodiment, an insulator stack 230 may be formed over the polarization layer 211. In an embodiment, the insulator stack 230 may comprise a plurality of insulating layers that have a non-uniform etch rate. For example, three distinct layers 231, 232, and 233 are shown in FIG. 2A. Each of the layers 231, 232, and 233 may comprise the same material, but have different treatments that result in different etch rates. For example, the layers 231, 232, and 233 may be silicon nitride that each have different plasma treatments that induce different etch rates. In other embodiments, the layers 231, 232, and 233 may comprise the same base material with different dopant concentrations that result in different etch rates.

In an embodiment, the 2DEG FET 200 may comprise a gate electrode 220. A main body of the gate electrode 220 may extend through an oxide layer 240, the insulator stack 230, and through the polarization layer 211. Particularly, a first portion 226 of the gate electrode may pass through the polarization layer 211 and a second portion 228 of the gate electrode may pass through the insulator stack 230. In an embodiment, the first portion 226 may have a first width $W_1$ and the second portion may have a stepped profile. For example, the second portion may comprise a plurality of steps 229 arising from a non-uniform width (e.g., widths $W_2$, $W_3$, and $W_N$). The variable widths $W_2$-$W_N$ may arise from the non-uniform etch rate of the layers 231-233. For example, the first layer 231 may have the largest etch rate, the second layer 232 may have the second largest etch rate, and the third layer 233 may have the smallest etch rate. In an embodiment, the number of steps 229 in the second portion 228 of the gate electrode 220 corresponds to the number of layers in the insulator stack 230. For example, in FIG. 2A there are three layers 231-233 and three steps 229.

In an embodiment, the widths $W_2$-$W_N$ of the second portion 228 of the gate electrode 220 are greater than the first width $W_1$ of the first portion 226 of the gate electrode 220. Particularly, portions of the second portion 228 may extend over the channel region 205 between the edge of the first portion 226 and source electrode 241 and between the edge of the first portion 226 and the drain electrode 242. Accordingly, the second portion 228 of the gate electrode 220 may function as a field plate that redistributes the electric field and improves the breakdown voltage of the 2DEG FET 200. In an embodiment, the second portion 228 of the gate electrode 220 may be substantially symmetric about a centerline 222 of the gate electrode 220.

In an embodiment, the first portion 226 and the second portion 228 of the gate electrode 220 may be lined with a gate dielectric 221. That is, the gate dielectric 221 may separate the first portion 226 of the gate electrode 220 from the channel region 205 in addition to lining the lateral and vertical surfaces of the second portion 228 of the gate electrode 220. In an embodiment, the gate dielectric 221 may be any suitable gate dielectric material, such as those described above.

Figure 2B:
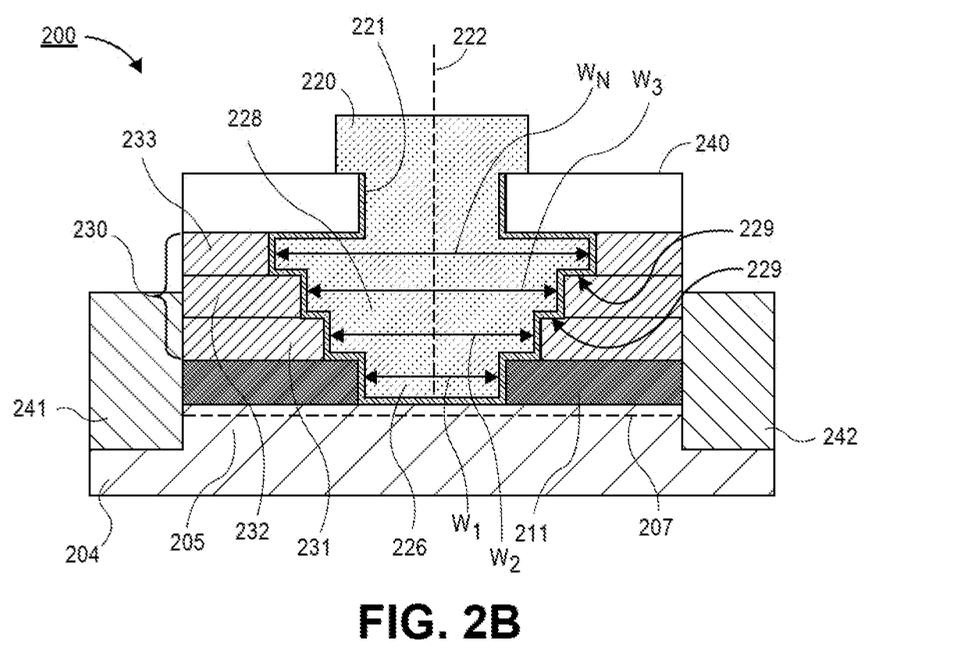
FIG. 2B is a cross-sectional illustration of a 2DEG FET with a gate electrode that includes an inverted stepped field plate, in accordance with an embodiment.

Referring now to FIG. 2B, a cross-sectional illustration of a 2DEG FET 200 is shown, in accordance with an additional embodiment. The 2DEG FET 200 in FIG. 2B is substantially similar to the 2DEG FET 200 in FIG. 2A with the exception that the second portion 228 is reversed. That is, $W_N$ is the largest width, $W_3$ is the next largest width, and $W_2$ is the smallest width. In an embodiment, the reversed second portion 228 of the gate electrode 220 may be obtained by having an insulator stack 230 with a first layer 231 with the smallest etch rate, followed by a second layer 232 with the next smallest etch rate, and a third layer 233 with the largest etch rate. In FIGS. 2A and 2B the etch rates of successive layers (from top to bottom) are increasing (FIG. 2B) or decreasing (FIG. 2A). However, it is to be appreciated that the successive layers do not have to be continually increasing or decreasing. For example, the first layer 231 and the third layer 233 may have the same etch rate and the second layer 232 may have an etch rate different from the first layer 231 and the third layer 233.

Referring now to FIGS. 3A-3E, a series of cross-sectional illustrations of a process for forming a 2DEG FET similar to the 2DEG FET 100 shown in FIG. 1A are shown, in accordance with an embodiment.

Figure 3A:
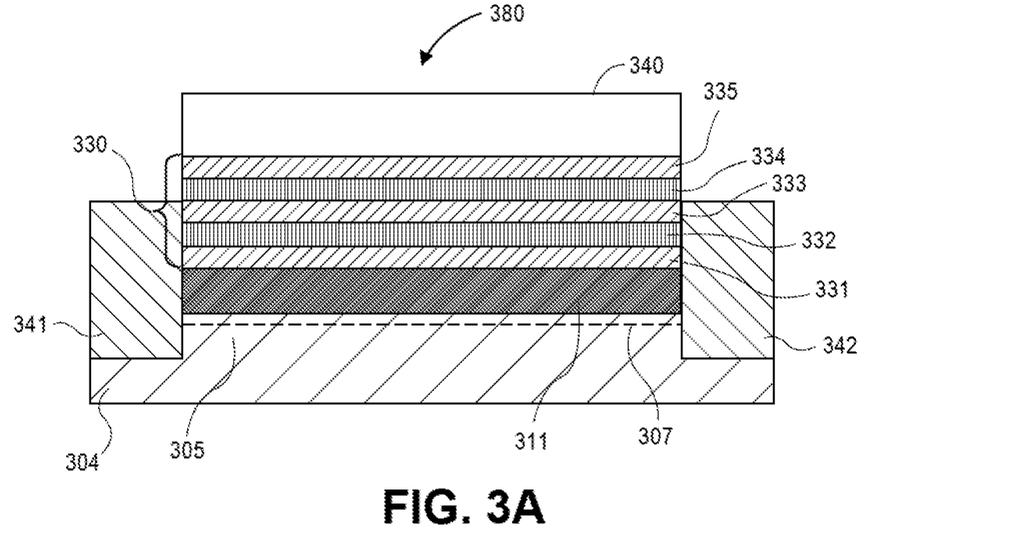
FIG. 3A is cross-sectional illustration of a semiconductor device with an insulator stack with alternating layers of oxide and nitride, in accordance with an embodiment.

Referring now to FIG. 3A, a cross-sectional illustration of a semiconductor device is shown, in accordance with an embodiment. In an embodiment, the semiconductor device may comprise a semiconductor substrate 304. For example, the semiconductor substrate 304 may be GaN or any other suitable semiconductor material for forming a 2DEG FET. In an embodiment, a channel region 305 may be formed between a source electrode 341 and a drain electrode 342. In an embodiment, a polarization layer 311 may be formed over the channel region 305. In an embodiment, a 2DEG 307 may be formed in the channel region 305 proximate to the interface between the polarization layer 311 and the channel region 305.

In an embodiment, an insulator stack 330 may be formed over the polarization layer 311. The insulator stack 330 may comprise a plurality of layers alternating between an etch resistant material and an etch susceptible material. For example, the etch resistant material may be silicon nitride and the etch susceptible material may be silicon oxide. In the illustrated embodiment, layers 331, 333, and 335 may be etch resistant material and layers 332 and 334 may be etch susceptible material. In an embodiment, the etch susceptible material layers 332 and 334 may have different etch selectivities. For example, layer 334 may have a higher etch rate than layer 332. However, it is to be appreciated that layers 334 and 332 may have the same etch rate, or layer 332 may have an etch rate that is greater than the etch rate of layer 334. In an embodiment, an oxide layer 340 may be formed over the insulator stack 330.

Figure 3B:
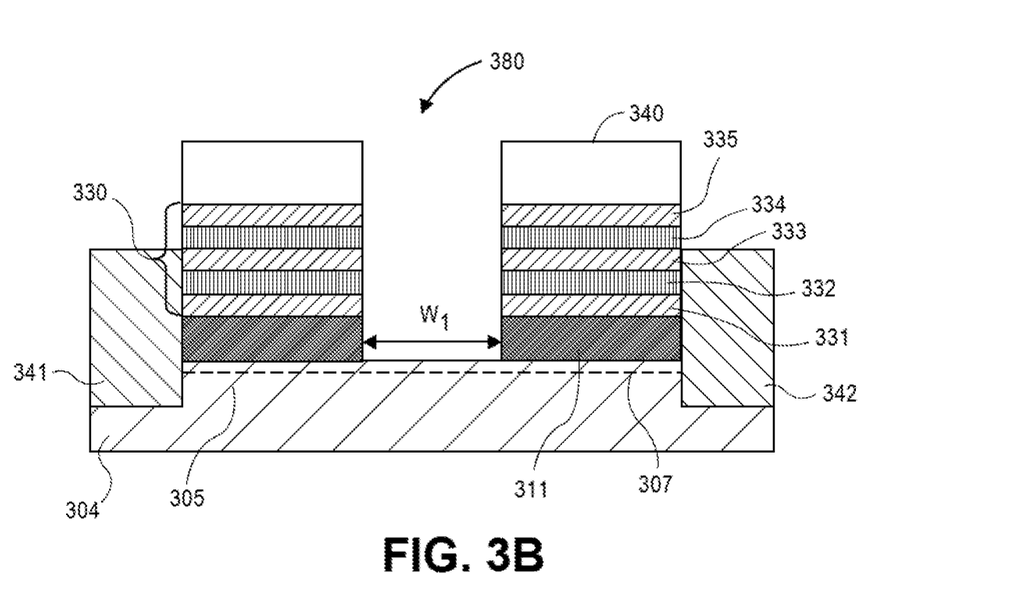
FIG. 3B is a cross-sectional illustration of the semiconductor device after a gate opening is formed through the insulator stack and a polarization layer, in accordance with an embodiment.

Referring now to FIG. 3B, a cross-sectional illustration of the semiconductor device after a gate opening 380 is formed is shown, in accordance with an embodiment. In an embodiment, the gate opening 380 may be a trench that has a substantially uniform width $W_1$. The gate opening 380 may pass through the oxide layer 340, the insulator stack 330, and the polarization layer 311. In an embodiment, the gate opening may be formed with a dry etching chemistry, such as a plasma etch.

Figure 3C:
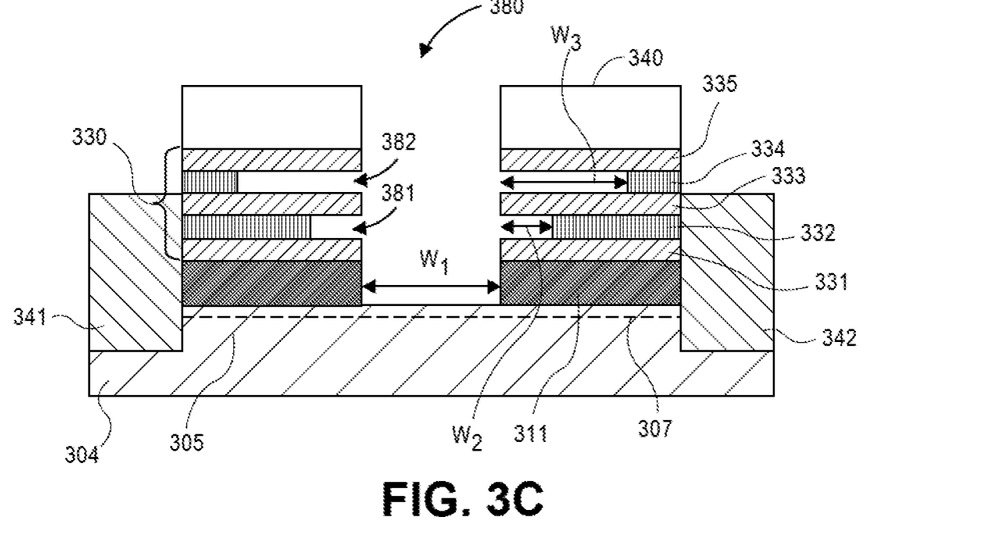
FIG. 3C is a cross-sectional illustration of the semiconductor device after field plate openings are selectively formed in the oxide layers of the insulator stack, in accordance with an embodiment.

Referring now to FIG. 3C, a cross-sectional illustration of the semiconductor device after field plate openings 381 and 382 are formed is shown, in accordance with an embodiment. In an embodiment, the field plate openings 381 and 382 may be formed by exposing the semiconductor device to a wet etching chemistry that preferentially etches the etch susceptible material in layers 332 and 334. For example, when the etch resistant material in layers 331, 333, and 335 is a silicon nitride and the etch susceptible material in layers 332 and 334 is a silicon oxide, the wet etching chemistry may include HF.

As shown in FIG. 3C, portions of layers 332 and 334 are removed to form openings 381 and 382 between layers 331, 333, and 335. In an embodiment, opening 381 may have a width $W_2$ and opening 382 may have a width $W_3$. In an embodiment where layer 334 has a higher etch rate than layer 332, the width $W_3$ may be greater than the width $W_2$.

Figure 3D:
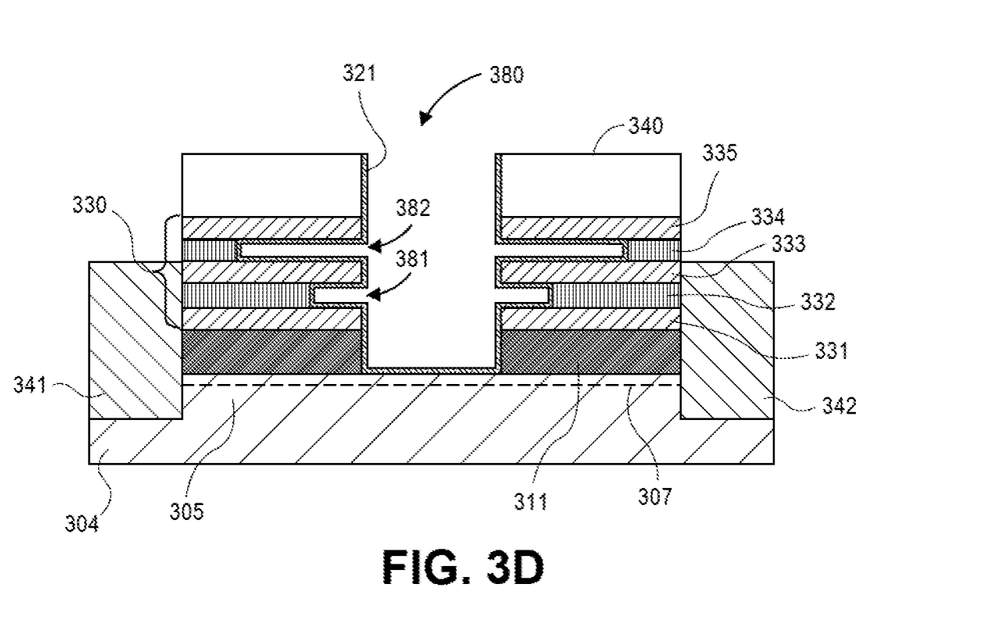
FIG. 3D is a cross-sectional illustration of the semiconductor device after a gate oxide is formed over surfaces of the gate opening and the field plate openings, in accordance with an embodiment.

Referring now to FIG. 3D, a cross-sectional illustration of the semiconductor device after a gate dielectric 321 is deposited is shown, in accordance with an embodiment. In an embodiment, the gate dielectric 321 may be deposited with a conformal deposition process (e.g., ALD) in order to cover surfaces of the gate opening 380 and the field plate openings 381 and 382. In an embodiment, the gate dielectric 321 may be a high-k dielectric material, such as those described above. In an embodiment, the gate dielectric 321 may have a thickness that is between 5 nm and 15 nm.

Figure 3E:
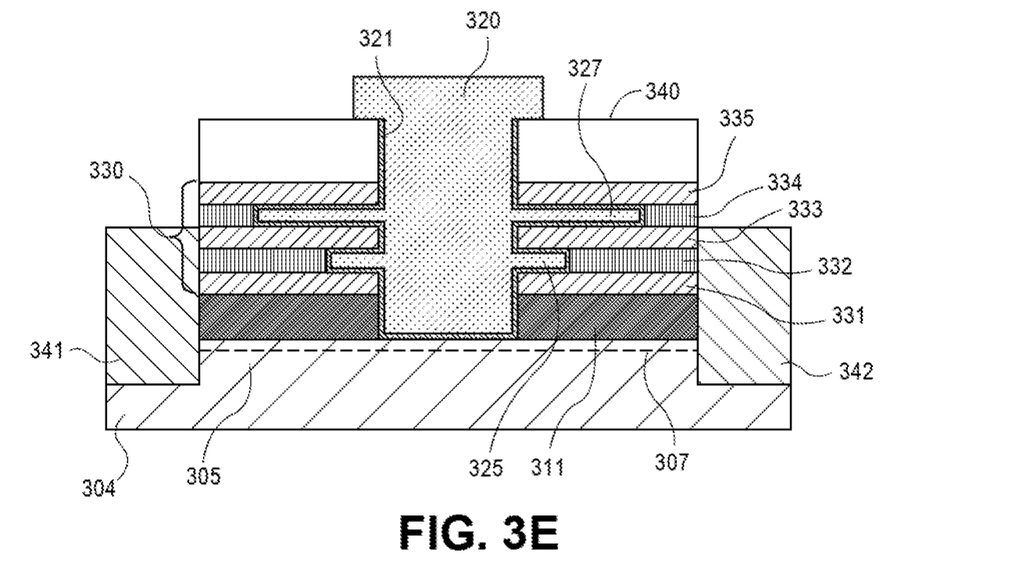
FIG. 3E is a cross-sectional illustration of the semiconductor device after a conductive material is deposited into the gate opening and the field plate openings, in accordance with an embodiment.

Referring now to FIG. 3E, a cross-sectional illustration after a metal layer is deposited to form the gate electrode 320 and the field plates 325, 327 is shown, in accordance with an embodiment. In an embodiment, the metal layer may be deposited with a conformal deposition process (e.g., ALD) in order to fill the field plate openings 381 and 382. In an embodiment, after the field plate openings 381 and 382 are filled, a deposition process with a higher deposition rate may be used to fill the remaining portions of the gate electrode 320. In an embodiment, the gate electrode 320 and the field plates 325, 327 may be formed with one or more metals or alloys of metals, such as with conductive materials described above.

Referring now to FIGS. 4A-4D a series of cross-sectional illustrations of a process for forming a 2DEG FET similar to the 2DEG FET 200 shown in FIG. 2A are shown, in accordance with an embodiment.

Figure 4A:
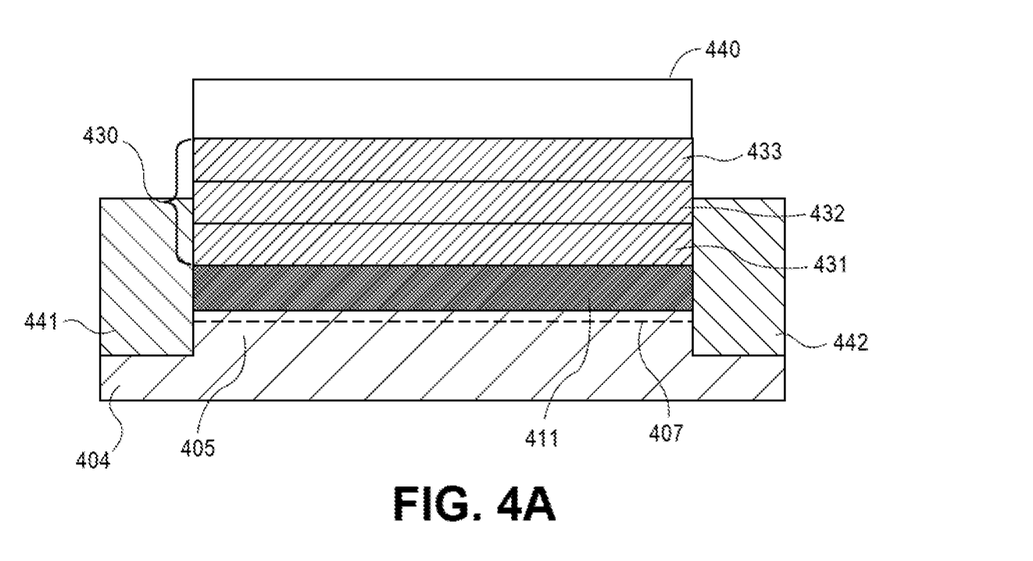
FIG. 4A is a cross-sectional illustration of a semiconductor device that includes an insulator stack comprising a plurality of insulating layers with different etch selectivities to a wet etching chemistry, in accordance with an embodiment.

Referring now to FIG. 4A, a cross-sectional illustration of a semiconductor device is shown, in accordance with an embodiment. In an embodiment, the semiconductor device may comprise a semiconductor substrate 404. For example, the semiconductor substrate 404 may be GaN or any other suitable semiconductor material for forming a 2DEG FET. In an embodiment, a channel region 405 may be formed between a source electrode 441 and a drain electrode 442. In an embodiment, a polarization layer 411 may be formed over the channel region 405. In an embodiment, a 2DEG 407 may be formed in the channel region 405 proximate to the interface between the polarization layer 411 and the channel region 405.

In an embodiment, an insulator stack 430 may be formed over the polarization layer 411. The insulator stack 430 may comprise a plurality of layers 431-433 that have non-uniform etch rates. For example, the first layer 431 may have the largest etch rate, the second layer 432 may have the second largest etch rate, and the third layer 433 may have the smallest etch rate. In FIG. 2A there are three layers 431-433 shown, however embodiments are not limited to such configurations and any number of layers may be included in the insulator stack 430.

In an embodiment, each of the layers 431, 432, and 433 may comprise the same material, but have different treatments that result in different etch rates. For example, the layers 431, 432, and 433 may be silicon nitride that each have different plasma treatments that induce different etch rates. In other embodiments, the layers 431, 432, and 433 may comprise the same base material with different dopant concentrations that result in different etch rates. In an embodiment, an oxide layer 440 may be formed over the insulator stack 430.

Figure 4B:
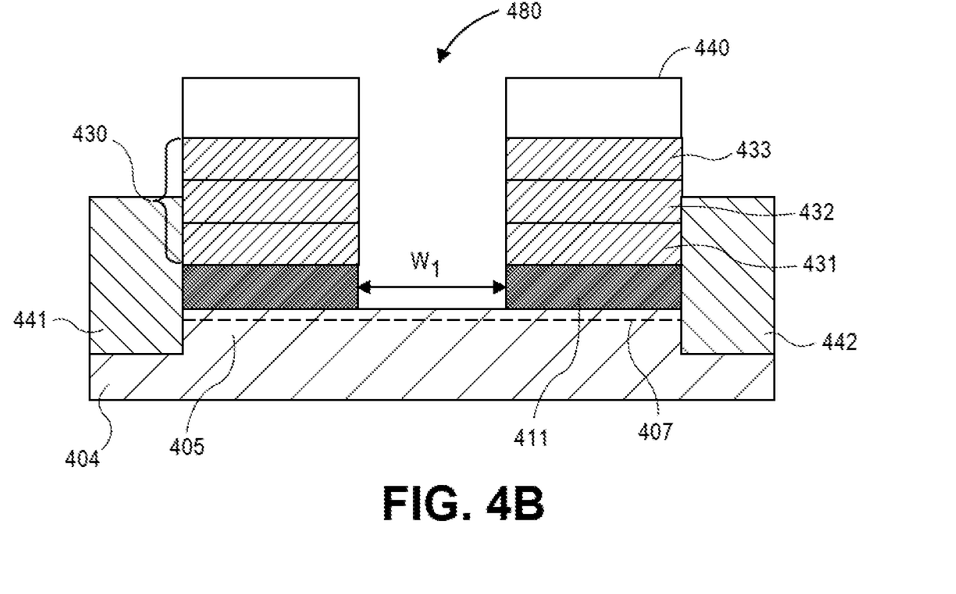
FIG. 4B is a cross-sectional illustration of the semiconductor device after a gate opening is formed through the insulator stack and a polarization layer, in accordance with an embodiment.

Referring now to FIG. 4B, a cross-sectional illustration of the semiconductor device after a gate opening 480 is formed is shown, in accordance with an embodiment. In an embodiment, the gate opening 480 may be a trench that has a substantially uniform width $W_1$. The gate opening 480 may pass through the oxide layer 440, the insulator stack 430, and the polarization layer 411. In an embodiment, the gate opening may be formed with a dry etching chemistry, such as a plasma etch.

Figure 4C:
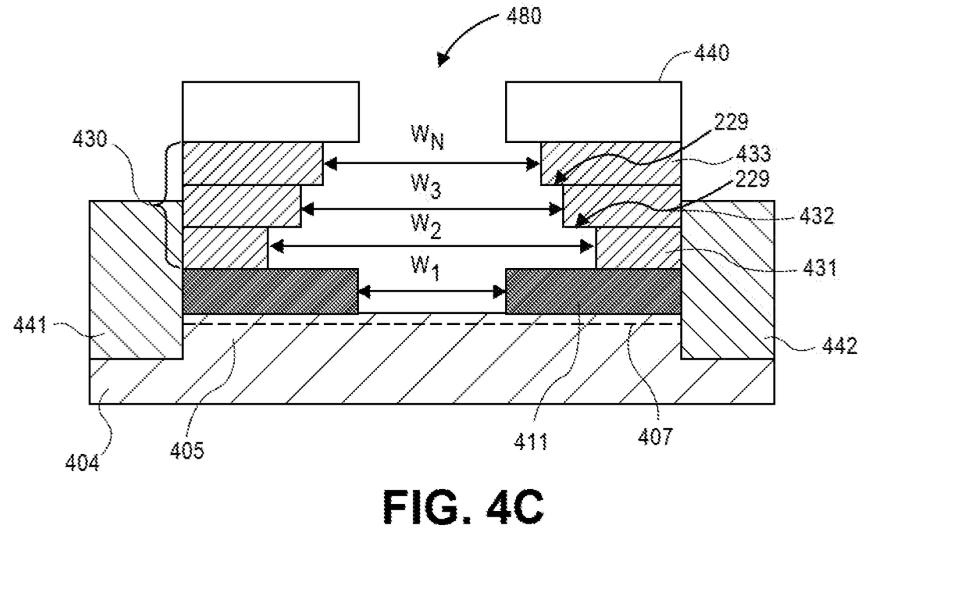
FIG. 4C is a cross-sectional illustration of the semiconductor device after the plurality of insulating layers are etched to form a stepped profile in the insulator stack, in accordance with an embodiment.

Referring now to FIG. 4C, a cross-sectional illustration of the semiconductor device after the insulator stack 430 is etched is shown, in accordance with an embodiment. In an embodiment, the insulator stack 430 may be etched by exposing the semiconductor device to a wet etching chemistry that preferentially etches the insulator stack 430. For example, the wet etching chemistry may include HF. Since the different layers 431-433 of the insulator stack 430 have different etch rates, a plurality of stepped surfaces 429 are formed. Particularly, the first layer 431 may be etched to have an opening with a width $W_2$, the second layer 432 may be etched to have an opening with a width $W_3$, and the third layer 433 may be etched to have an opening with a width $W_N$. In an embodiment, the width $W_2$ is the largest, followed by the width $W_3$, and finally the width $W_N$. However, it is to be appreciated that depending on the etch rates of each layer 431-433, the dimensions of the openings in each layer may be modified. For example, when the etch rates are reversed (i.e., when the third layer 432 has the highest etch rate, followed by the second layer 432, and the first layer 431 has the smallest etch rate), a device similar to the one shown in FIG. 2B may be fabricated.

Figure 4D:
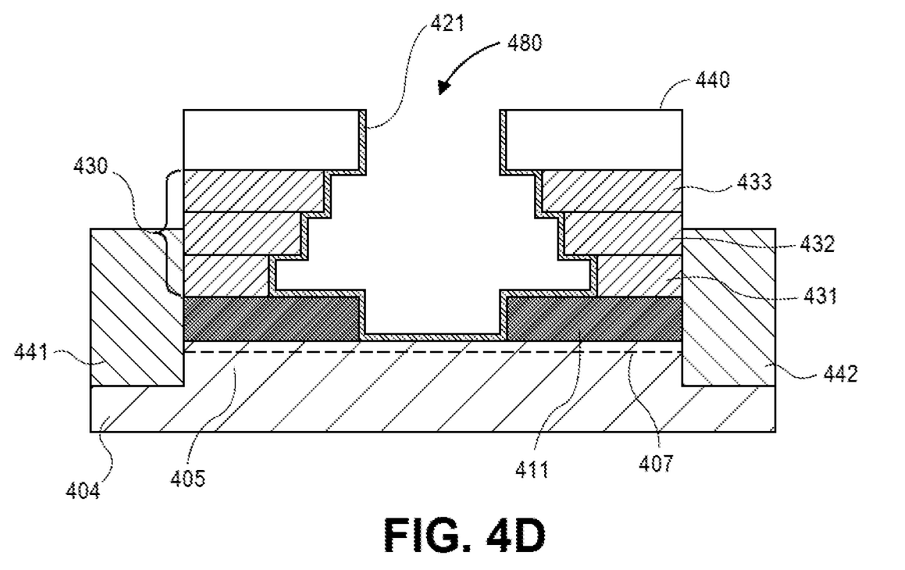
FIG. 4D is a cross-sectional illustration of the semiconductor device after a gate oxide is formed over surfaces of the gate opening, in accordance with an embodiment.

Referring now to FIG. 4D, a cross-sectional illustration of the semiconductor device after a gate dielectric 421 is deposited is shown, in accordance with an embodiment. In an embodiment, the gate dielectric 421 may be deposited with a conformal deposition process (e.g., ALD) in order to cover surfaces of the gate opening 480. In an embodiment, the gate dielectric 421 may be a high-k dielectric material, such as those described above. In an embodiment, the gate dielectric 421 may have a thickness that is between 5 nm and 15 nm.

Figure 4E:
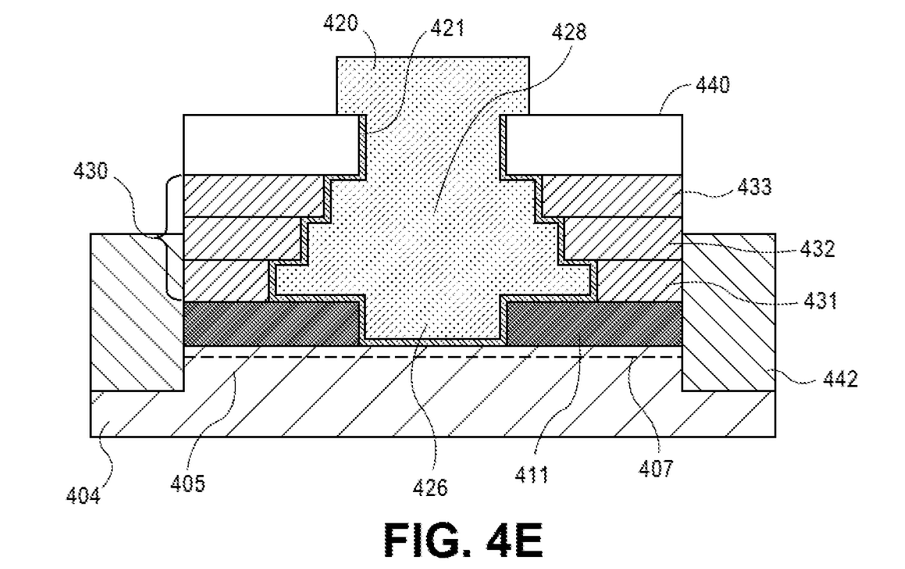
FIG. 4E is a cross-sectional illustration of the semiconductor device after a conductive material is deposited in the gate opening, in accordance with an embodiment.

Referring now to FIG. 4E, a cross-sectional illustration after a metal layer is deposited to form the gate electrode 420 is shown, in accordance with an embodiment. In an embodiment, the metal layer may be deposited to form a first portion 426 of the gate electrode 420 through the polarization layer 411 and a second portion 428 through the insulator stack 430. In an embodiment, the gate electrode 420 may be formed with one or more metals or alloys of metals, such as with conductive materials described above.

Although the preceding methods of fabricating 2DEG FETs are described in detail with respect to select operations, it is to be appreciated that additional or intermediate operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed or both.

In an embodiment, as is also used throughout the present description, lithographic operations are performed using 193 nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 5:
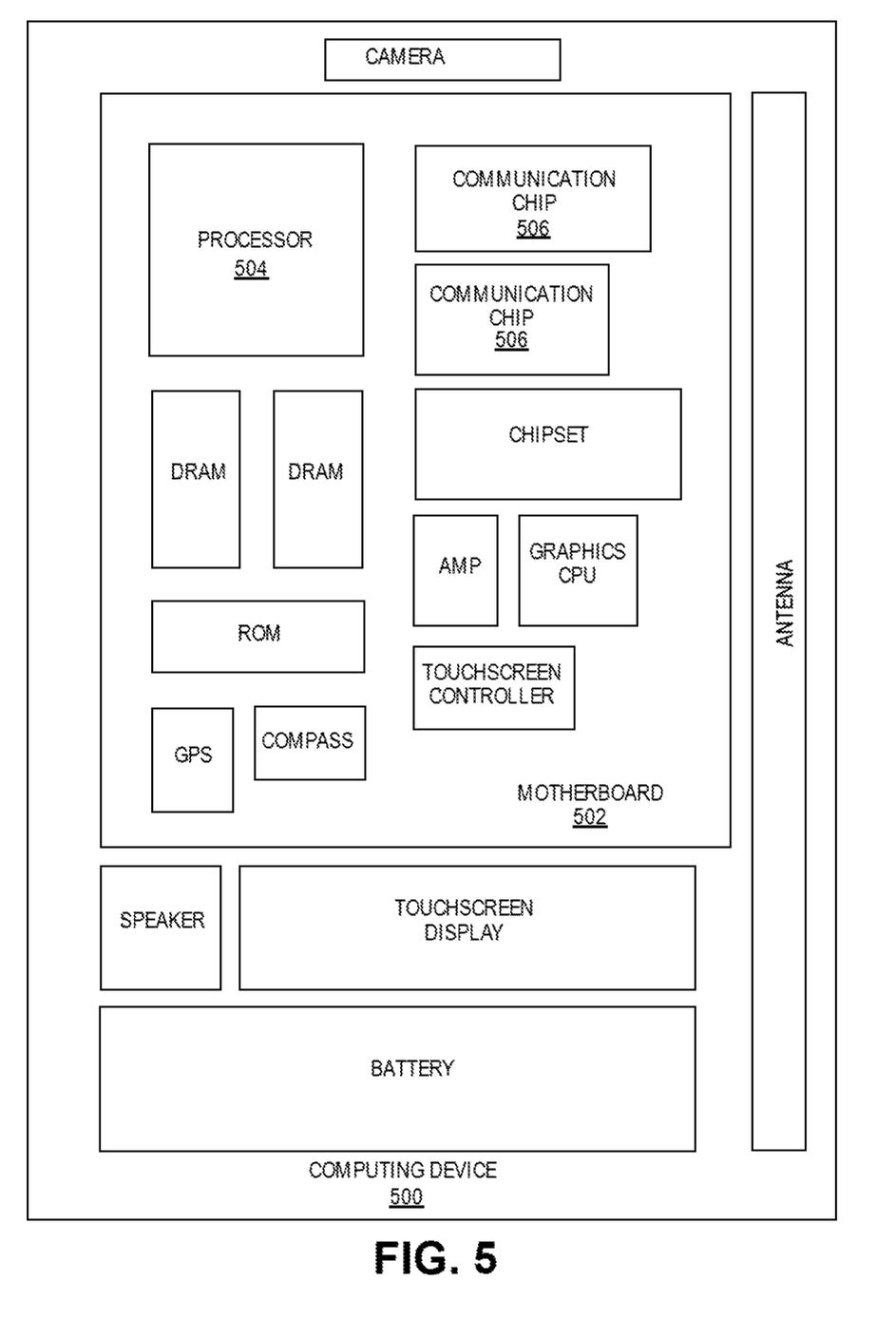
FIG. 5 illustrates a computing device in accordance with one implementation of an embodiment of the disclosure.

FIG. 5 illustrates a computing device 500 in accordance with one implementation of an embodiment of the disclosure. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In an embodiment, the integrated circuit die of the processor includes a 2DEG FET with field plates integrated with the gate electrode, as described herein. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In an embodiment, the integrated circuit die of the communication chip includes a 2DEG FET with field plates integrated with the gate electrode, as described herein.

In further implementations, another component housed within the computing device 500 may contain an integrated circuit die that includes a 2DEG FET with field plates integrated with the gate electrode, as described herein.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
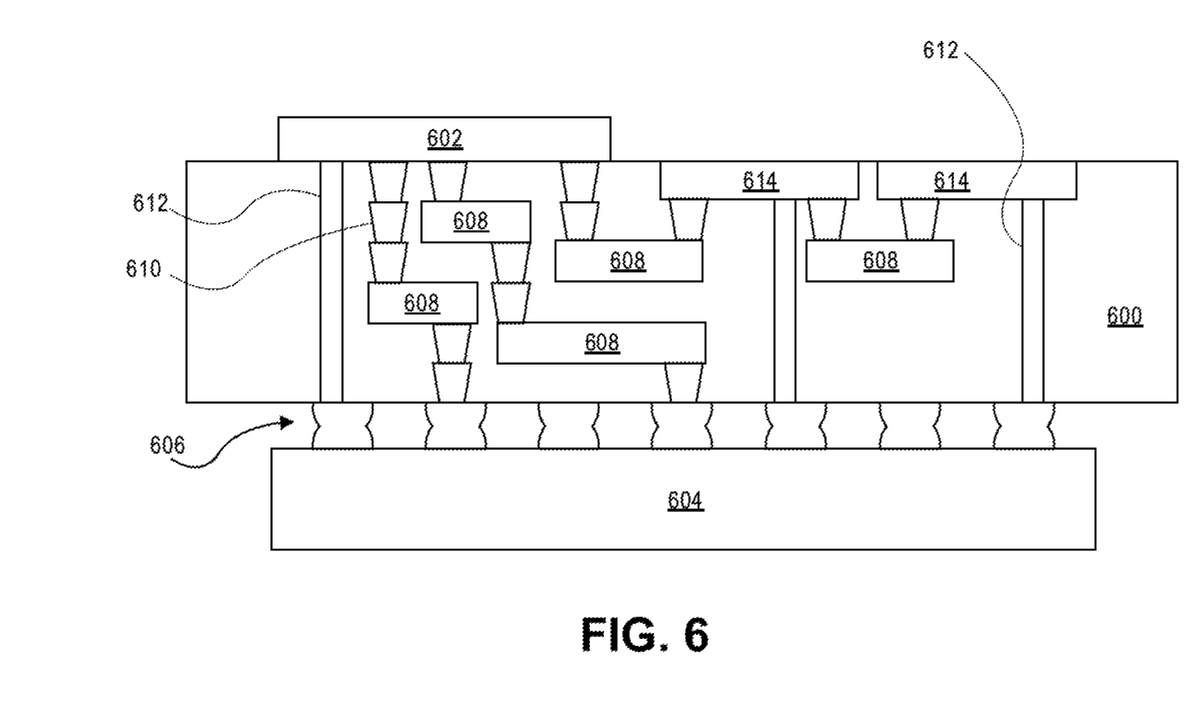
FIG. 6 is an interposer implementing one or more embodiments of the disclosure.

FIG. 6 illustrates an interposer 600 that includes one or more embodiments of the disclosure. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the disclosure, apparatuses or processes disclosed herein may be used in the fabrication of interposer 600.

Thus, embodiments of the present disclosure includes a 2DEG FET with field plates integrated with the gate electrode, and the resulting structures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a transistor, comprising: a semiconductor channel; a source electrode on a first side of the semiconductor channel; a drain electrode on a second side of the semiconductor channel; a polarization layer over the semiconductor channel; an insulator stack over the polarization layer; and a gate electrode over the semiconductor channel, wherein the gate electrode comprises: a main body that passes through the insulator stack and into the polarization layer; and a first field plate extending out laterally from the main body.

Example 2: the transistor of Example 1, wherein the first field plate extends out laterally towards the drain electrode.

Example 3: the transistor of Example 1 or Example 2, further comprising a second field the field plate that extends out laterally towards the source electrode.

Example 4: the transistor of Examples 1-3, further comprising a second field plate extending out laterally from the main body.

Example 5: the transistor of Examples 1-4, wherein the first field plate is closer to the semiconductor channel than the second field plate.

Example 6: the transistor of Examples 1-5, wherein the first field plate has a first length and the second field plate has a second length that is different than the first length.

Example 7: the transistor of Examples 1-6, wherein the first length is shorter than the second length.

Example 8: the transistor of Examples 1-7, wherein the first length is longer than the second length.

Example 9: the transistor of Examples 1-8, wherein the insulator stack comprises alternating layers of silicon nitride and oxide.

Example 10: the transistor of Examples 1-9, wherein the first field plate is positioned in a first oxide layer of the insulator stack and the second field plate is positioned in a second oxide layer of the insulator stack.

Example 11: the transistor of Examples 1-10, wherein the first oxide layer is a different oxide than the second oxide layer.

Example 12: the transistor of Examples 1-11, further comprising a gate oxide surrounding gate electrode, wherein the gate oxide surrounds the main body and the first field plate.

Example 13: a transistor, comprising: a semiconductor channel; a source electrode on a first side of the semiconductor channel; a drain electrode on a second side of the semiconductor channel; a polarization layer over the semiconductor channel; an insulator stack over the polarization layer, wherein the insulator stack comprises a non-uniform etch selectivity in the thickness direction; and a gate electrode over the semiconductor channel, wherein the gate electrode comprises: a first portion into the polarization layer, wherein the first portion has a first width; a second portion passing through the insulator stack, wherein the second portion includes a stepped profile.

Example 14: the transistor of Example 13, wherein the stepped profile is symmetric about a centerline of the second portion.

Example 15: the transistor of Example 13 or Example 14, wherein the second portion comprises a second width that is greater than the first width.

Example 16: the transistor of Examples 13-15, wherein the stepped profile comprises a first step and a second step, wherein the first step is closer to the semiconductor substrate than the second step.

Example 17: the transistor of Examples 13-16, wherein the first step has a width that is greater than a width of the second step.

Example 18: the transistor of Examples 13-17, wherein the first step has a width that is less than a width of the second step.

Example 19: the transistor of Examples 13-18, wherein the insulator stack comprises a plurality of layers of silicon nitride, wherein the layers have different etch rates.

Example 20: the transistor of Examples 13-19, wherein the silicon nitride layers are treated with different plasma treatments to provide the different etch rates.

Example 21: a method of forming a transistor, comprising: providing a semiconductor channel, a source electrode on a first side of the semiconductor channel, a drain electrode on a second side of the semiconductor channel, a polarization layer over the semiconductor channel, and an insulator stack over the polarization layer; forming a gate electrode opening through the insulator stack and the polarization layer, wherein the gate opening has a first width; forming a field plate opening in the insulator stack; forming a gate oxide over surfaces of the gate electrode opening and the field plate opening; and depositing a conductive layer into the gate electrode opening and the field plate opening.

Example 22: the method of Example 21, wherein the insulator stack comprises alternating layers of silicon nitride and oxide, wherein the field plate opening is formed in a first oxide layer.

Example 23: the method of Example 21 or Example 22, wherein the insulator stack further comprises a second oxide layer, wherein the first oxide layer and the second oxide layer have different etch rates.

Example 24: a computing system, comprising: a motherboard; a processor electrically coupled to the motherboard; and a communication chip electrically coupled to the motherboard, wherein one or both of the processor and the communication chip comprise a transistor, comprising: a semiconductor channel; a source electrode on a first side of the semiconductor channel; a drain electrode on a second side of the semiconductor channel; a polarization layer over the semiconductor channel; an insulator stack over the polarization layer; and a gate electrode over the semiconductor channel, wherein the gate electrode comprises: a main body that passes through the insulator stack and into the polarization layer; and a first field plate extending out laterally from the main body.

Example 24: the computing system of Example 24, wherein the computing system is a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

What is claimed is:

1. A transistor, comprising:
    a semiconductor channel;
    a source electrode on a first side of the semiconductor channel;
    a drain electrode on a second side of the semiconductor channel;
    a polarization layer over the semiconductor channel;
    an insulator stack over the polarization layer, wherein the insulator stack comprises alternating layers of silicon nitride and oxide; and
    a gate electrode over the semiconductor channel, wherein the gate electrode comprises:
        a main body that passes through the insulator stack and into the polarization layer;
        a first field plate extending out laterally from the main body; and
        a second field plate extending out laterally from the main body, the second field plate vertically over the first field plate, wherein the first field plate extends laterally beyond the second field plate, and wherein the first field plate is positioned in a first oxide layer of the insulator stack and the second field plate is positioned in a second oxide layer of the insulator stack.

2. The transistor of claim 1, wherein the first field plate extends out laterally towards the drain electrode.

3. The transistor of claim 2, further comprising a third field that extends out laterally towards the source electrode.

4. The transistor of claim 1, wherein the first oxide layer is a different oxide than the second oxide layer.

5. The transistor of claim 1, further comprising a gate oxide surrounding gate electrode, wherein the gate oxide surrounds the main body and the first field plate.

6. A transistor, comprising:
    a semiconductor channel;
    a source electrode on a first side of the semiconductor channel;
    a drain electrode on a second side of the semiconductor channel;
    a polarization layer over the semiconductor channel;
    an insulator stack over the polarization layer, wherein the insulator stack comprises a non-uniform etch selectivity in the thickness direction; and
    a gate electrode over the semiconductor channel, wherein the gate electrode comprises:
        a first portion into the polarization layer, wherein the first portion has a first width; and
        a second portion passing through the insulator stack, wherein the second portion includes a stepped profile comprising a first field plate extending out laterally from the first portion, and a second field plate extending out laterally from the first portion, the second field plate vertically over the first field plate, wherein the first field plate extends laterally beyond the second field plate.

7. The transistor of claim 6, wherein the stepped profile is symmetric about a centerline of the second portion.

8. The transistor of claim 6, wherein the insulator stack comprises a plurality of layers of silicon nitride, wherein the layers have different etch rates.

9. The transistor of claim 8, wherein the silicon nitride layers are treated with different plasma treatments to provide the different etch rates.

10. A method of forming a transistor, comprising:
    providing a semiconductor channel, a source electrode on a first side of the semiconductor channel, a drain electrode on a second side of the semiconductor channel, a polarization layer over the semiconductor channel, and an insulator stack over the polarization layer;
    forming a gate electrode opening through the insulator stack and into the polarization layer, wherein the gate opening has a first width;
    forming a field plate opening in the insulator stack;

forming a gate oxide over surfaces of the gate electrode opening and the field plate opening; and depositing a conductive layer into the gate electrode opening and the field plate opening to form a gate electrode, wherein the gate electrode comprises a main body that passes through the insulator stack and into the polarization layer, a first field plate extending out laterally from the main body, and a second field plate extending out laterally from the main body, the second field plate vertically over the first field plate, wherein the first field plate extends laterally beyond the second field plate.

11. The method of claim 10, wherein the insulator stack comprises alternating layers of silicon nitride and oxide, wherein the field plate opening is formed in a first oxide layer.

12. The method of claim 11, wherein the insulator stack further comprises a second oxide layer, wherein the first oxide layer and the second oxide layer have different etch rates.

13. A computing system, comprising:
a motherboard;
a processor electrically coupled to the motherboard; and
a communication chip electrically coupled to the motherboard, wherein one or both of the processor and the communication chip comprise a transistor, comprising:
a semiconductor channel;
a source electrode on a first side of the semiconductor channel;
a drain electrode on a second side of the semiconductor channel;
a polarization layer over the semiconductor channel;
an insulator stack over the polarization layer, wherein the insulator stack comprises alternating layers of silicon nitride and oxide; and
a gate electrode over the semiconductor channel, wherein the gate electrode comprises:
a main body that passes through the insulator stack and into the polarization layer;
a first field plate extending out laterally from the main body; and
a second field plate extending out laterally from the main body, the second field plate vertically over the first field plate, wherein the first field plate extends laterally beyond the second field plate, and wherein the first field plate is positioned in a first oxide layer of the insulator stack and the second field plate is positioned in a second oxide layer of the insulator stack.

14. The computing system of claim 13, wherein the computing system is a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

15. A transistor, comprising:
a semiconductor channel;
a source electrode on a first side of the semiconductor channel;
a drain electrode on a second side of the semiconductor channel;
a polarization layer over the semiconductor channel;
an insulator stack over the polarization layer; and
a gate electrode over the semiconductor channel, wherein the gate electrode comprises:
a main body that passes through the insulator stack and into the polarization layer;
a first field plate extending out laterally from the main body;
a second field plate extending out laterally from the main body, the second field plate vertically over the first field plate, wherein the first field plate extends laterally beyond the second field plate; and
a gate oxide surrounding gate electrode, wherein the gate oxide surrounds the main body and the first field plate.

\* \* \* \* \*